United States Patent
Kim et al.

(10) Patent No.: US 7,531,833 B2
(45) Date of Patent: May 12, 2009

(54) ORGANIC ELECTRO LUMINESCENCE DEVICE AND FABRICATION METHOD THEREOF

(75) Inventors: Chang Yeon Kim, Anyang-si (KR); Tae Joon Ahn, Seoul (KR)

(73) Assignee: LG. Display Co., Ltd., Seoul (KR)

( * ) Notice: Subject to any disclaimer, the term of this patent is extended or adjusted under 35 U.S.C. 154(b) by 450 days.

(21) Appl. No.: 11/257,409

(22) Filed: Oct. 12, 2005

(65) Prior Publication Data
US 2006/0081854 A1    Apr. 20, 2006

(30) Foreign Application Priority Data
Oct. 12, 2004  (KR) .................. 10-2004-0081269

(51) Int. Cl.
*H01L 29/08* (2006.01)
(52) U.S. Cl. .................. 257/40; 257/E51.018
(58) Field of Classification Search ............ 257/72, 257/40
See application file for complete search history.

(56) References Cited

U.S. PATENT DOCUMENTS

| | | | |
|---|---|---|---|
| 6,548,961 B2 * | 4/2003 | Barth et al. | 315/169.3 |
| 6,614,174 B1 * | 9/2003 | Urabe et al. | 313/504 |
| 2004/0038600 A1 * | 2/2004 | Miyazawa et al. | 439/894 |
| 2005/0023956 A1 * | 2/2005 | Kwak et al. | 313/495 |

* cited by examiner

*Primary Examiner*—Bilkis Jahan
(74) *Attorney, Agent, or Firm*—Brinks Hofer Gilson & Lione

(57) ABSTRACT

An organic electro luminescence device and a fabrication method thereof are provided. An array element is formed on a first substrate and an electro luminescent diode is formed on a second substrate. The array element and the electro luminescent diode are electrically connected together by a spacer. A separator divides a sub pixel into a first region and a second region. In the electro luminescent diode, an anode electrode is formed over the first and second regions. An organic electro luminescent layer and a cathode electrode are formed on the anode electrode of one of the first and second regions.

24 Claims, 12 Drawing Sheets

ORGANIC ELECTRO LUMINESCENCE DEVICE AND FABRICATION METHOD THEREOF

CLAIM FOR PRIORITY

This application claims the benefit of priority under 35 U.S.C. § 119 to Korean application 81269/2004, filed on Oct. 12, 2004, herein incorporated by reference.

BACKGROUND OF THE INVENTION

1. Field of the Invention

The present invention relates to an organic electro luminescence device, and more particularly, to an organic electro luminescence device which is capable of improving the light efficiency and aperture ratio and a fabrication method thereof.

2. Description of the Related Art

One of new flat panel displays (FPD) is an organic electro luminescence device. Since the organic electro luminescence device is a self-luminous display device, it has a high contrast and wide viewing angle compared with the LCD. Also, since the organic electro luminescence device does not require a backlight assembly, it is lightweight and slim. In addition, the organic electro luminescence device can decrease power consumption.

Further, the organic electro luminescence device can be driven at a low DC voltage and has a rapid response time. Since all of the components of the organic electro luminescence device are formed of solid materials, it is endurable against external impact. It can also be used in a wide temperature range and can be manufactured at a low cost.

Specifically, the organic electro luminescence device is easily fabricated using a deposition apparatus and an encapsulation apparatus. Therefore, the fabrication method and apparatus of the organic electro luminescence device are simpler than those of an LCD or PDP.

Such a related art organic electro luminescence device is driven in a passive matrix mode that does not require separate switching elements. In the passive matrix mode, scan lines and signal lines are crossed with one another to thereby define pixels in a matrix form. In order to drive pixels, the scan lines are sequentially driven according to time. Therefore, in order to produce a desired mean brightness, the passive matrix organic electro luminescence device provides an instantaneous brightness corresponding to a product of the mean brightness and the number of lines.

In an active matrix mode, however, a thin film transistor (TFT) acting as a switching element to turn on/off pixel is disposed in each sub-pixel. A first electrode connected to the TFT is switched on/off based on the sub-pixel, and a second electrode facing the first electrode is a common electrode.

In the active matrix, since a voltage applied to the pixel is charged in a storage capacitor ($C_{ST}$), a voltage is applied until a next frame signal is inputted. Therefore, the organic electro luminescence device is continuously driven during a current frame period regardless of the number of scan lines.

If the organic electro luminescence device is driven in an active matrix mode, uniform brightness can be obtained even when a low current is applied. Accordingly, the active matrix organic electro luminescence device has advantages of low power consumption, high definition, and large-sized screen.

Hereinafter, a basic structure and operational characteristic of an active matrix organic electro luminescence device will be described in detail.

FIG. 1 is a circuit diagram of a related art active matrix organic electro luminescence device.

Referring to FIG. 1, a scan line 2 is formed in a first direction. A signal line 3 and a power supply line 4 are formed in a second direction crossing the first direction and spaced apart from each other by a predetermined distance. One sub pixel region is defined by the scan line 2, the signal line 3, and the power supply line 4.

A switching TFT 5 acting as an addressing element is formed at an intersection of the scan line 2 and the signal line 3. A storage capacitor $C_{ST}$ 6 is connected to the switching TFT 5 and the power supply line 4. A drive TFT 7 acting as a current source element is connected to the storage capacitor $C_{ST}$ and the power supply line 4. An electro luminescent diode 8 is connected to the drive TFT 7.

When a forward current is supplied to an organic luminescent material of the electro luminescent diode 8, electrons and holes moves and are recombined due to the P-N junction between an anode electrode acting as a hole providing layer and a cathode electrode acting as an electron providing layer. At this time, light is emitted.

The organic electro luminescence device is classified into a top emission type organic electro luminescence device and a bottom emission type organic electro luminescence device according to an emission direction of the electro luminescent diode 8.

FIG. 2 is a schematic sectional view of a related art bottom emission type organic electro luminescence device. In FIG. 1, only one pixel region including red, green and blue sub-pixels is illustrated for conciseness.

Referring to FIG. 2, first and second substrates 10 and 30 are arranged to face each other. Edge portions of the first and second substrates 10 and 30 are encapsulated by a seal pattern 40. A TFT T is formed on a transparent substrate 1 of the first substrate 10 in sub-pixel unit. A first electrode 12 is connected to the TFT T. An organic electro luminescent layer 14 is formed on the TFT T and the first electrode 12 and is arranged corresponding to the first electrode 12. The organic electro luminescent layer 14 contains light emission materials taking on red, green and blue colors. A second electrode 16 is formed on the organic electro luminescent layer 14.

The first and second electrodes 12 and 16 function to apply an electric field to the organic electro luminescent layer 14.

Due to the seal pattern 40, the second electrode 16 and the second substrate 30 are spaced apart from each other by a predetermined distance. Therefore, an absorbent (not shown) and a translucent tape (not shown) may be further provided in an inner surface of the second substrate 30. The absorbent absorbs moisture introduced from an exterior, and the translucent tape adheres the absorbent to the second substrate 30.

In the bottom emission type structure, when the first electrode 12 and the second electrode 16 are used as an anode and a cathode, respectively, the first electrode 12 is formed of a transparent conductive material and the second electrode 16 is formed of a metal having a low work function. In such a condition, the organic electro luminescent layer 14 includes a hole injection layer 14a, a hole transporting layer 14b, an emission layer 14c, and an electron transporting layer 14d, which are sequentially formed on the first electrode 12.

The emission layer 14c has red, green and blue color filters for sub-pixels.

FIG. 3 is an enlarged sectional view of one sub-pixel region in the bottom emission type organic electro luminescence device shown in FIG. 2.

Referring to FIG. 2, a semiconductor layer 62, a gate electrode 68, and source and drain electrodes 80 and 82 are sequentially formed on a transparent substrate 1, thus defining a TFT region. A power electrode 72 extending from a power line (not shown) and an electro luminescent diode E are connected to the source and drain electrodes 80 and 82.

A capacitor electrode 64 is disposed at a lower portion corresponding to the power electrode 72. A dielectric layer is interposed between the power electrode 72 and the capacitor electrode 64. A region corresponding to these layers is a storage capacitor region.

Except the electro luminescent diode E, the elements formed in the TFT region and the storage capacitor region are an array element A.

The electro luminescent diode E includes a first electrode 12, a second electrode 16, and an organic electrode luminescent layer 14 interposed between the first and second electrodes 12 and 16. The electro luminescent diode E is disposed in an emission region from which a self-luminous light is emitted.

Like this, in the related art organic electro luminescence device, the array element (A) and the electro luminescent diode (E) are stacked on the same substrate.

FIG. 4 is a flowchart illustrating a method for fabricating the related art organic electro luminescence device.

Referring to FIG. 4, an array element is formed on a first substrate (st1). The first substrate is a transparent substrate. The array element includes a scan line, a signal line perpendicular to the scan line and spaced apart from the scan line by a predetermined distance, a power supply line, a switching TFT formed at an intersection of the scan line and the signal line, and a drive TFT connected to the switching TFT.

A first electrode as a first component of the electro luminescent diode is formed and is connected to the drive TFT (st2). The first electrode is patterned in each sub pixel.

An organic electro luminescent layer as a second component of the electro luminescent diode is formed on the first electrode (st3). When the first electrode is used as the anode electrode, the organic electro luminescent layer can include a hole injection layer, a hole transporting layer, an emission layer, and an electron transporting layer, which are sequentially stacked in this order.

A second electrode as a third component of the electro luminescent diode is formed on the organic electro luminescent layer (st4). The second electrode is formed as a common electrode on the substrate.

The first substrate is encapsulated using the second substrate (st5). The second substrate protects the first substrate from external impact and prevents the organic electro luminescent layer from being damaged due to introduction of outdoor air. An absorbent may be included in an inner surface of the second substrate.

Like this, the bottom emission type organic electro luminescence device is fabricated by attaching the substrate, where the array element and the organic electro luminescent diode are formed, to the separate substrate provided for the encapsulation. In this case, the yield of the organic electro luminescence device is determined by the product of the yield of the array element and the yield of the organic electro luminescent diode. Therefore, the entire process yield is greatly restricted by the late process, that is, the process of forming the organic electro luminescent diode. For example, even though excellent array elements are formed, if foreign particles or other factors cause defects in forming the organic electro luminescent layer of a thin film of about 1000 Å thick, the corresponding organic electro luminescence device is decided as a defective grade.

Thus, the expense and material cost spent in fabricating the non-defective array element is lost, resulting in the reduction of the yield.

In addition, the bottom emission type organic electro luminescence device has high stability and high degree of freedom due to the encapsulation, but has limitation in aperture ratio. Thus, the bottom emission type organic electro luminescence device is difficult to apply to high-definition products. Meanwhile, in the case of the top emission type organic electro luminescence device, the design of the TFTs is easy and the aperture ratio is high. Thus, it is advantageous in view of lifetime of the product. However, since the cathode is disposed on the organic electro luminescent layer, the selection of material is restricted. Consequently, the transmittance is limited and the luminous efficiency is degraded.

SUMMARY OF THE INVENTION

By way of introduction only, in one embodiment an organic electro luminescence device includes: first and second substrates arranged spaced apart from each other by a predetermined distance; an array element including a switching TFT (thin film transistor) corresponding to a sub pixel on the first substrate; a first electrode disposed corresponding to the sub pixel on the second substrate; a separator for separating the sub pixel into a first region and a second region on the first electrode; an organic electro luminescent layer and a second electrode formed on the first electrode of the first region; and a spacer for electrically connecting the first electrode of the second region and the array element.

In another aspect of the present invention, there is provided an organic electro luminescence device including: first and second substrates spaced apart from each other by a predetermined distance; an array element including a switching TFT (thin film transistor) corresponding to a sub pixel on the first substrate, the sub pixel being divided into a first region and a second region; an electro luminescent diode formed corresponding to the sub pixel on the second substrate; and a spacer for electrically connecting the array element and the electro luminescent diode.

In a further aspect of the present invention, there is provided a fabrication method of an organic electro luminescence device, the fabrication method including: forming an array element including a TFT (thin film transistor) corresponding to a sub pixel divided into a first region and a second region on a first substrate; forming a first electrode corresponding to the sub pixel on the second substrate; forming a separator on the first electrode so as to separate the sub pixel into the first region and the second region; forming an organic electro luminescent layer on the first electrode of one of the first and second regions; forming a second electrode on the organic electro luminescent layer; electrically connecting the array element of the first substrate and the first electrode of the second substrate; and attaching the first substrate to the second substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
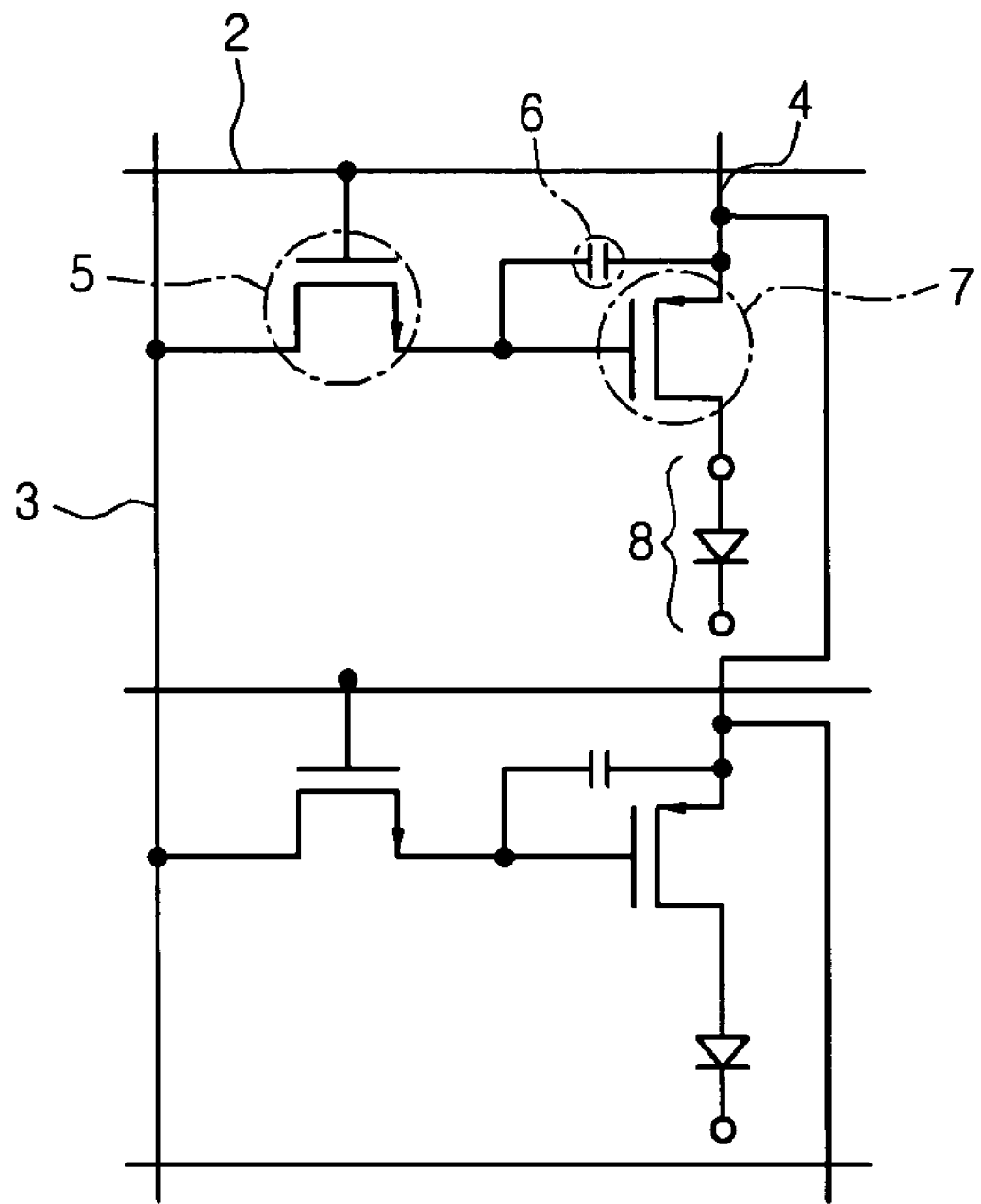
FIG. 1 is a circuit diagram of a related art active matrix organic electro luminescence device.
Figure 2:
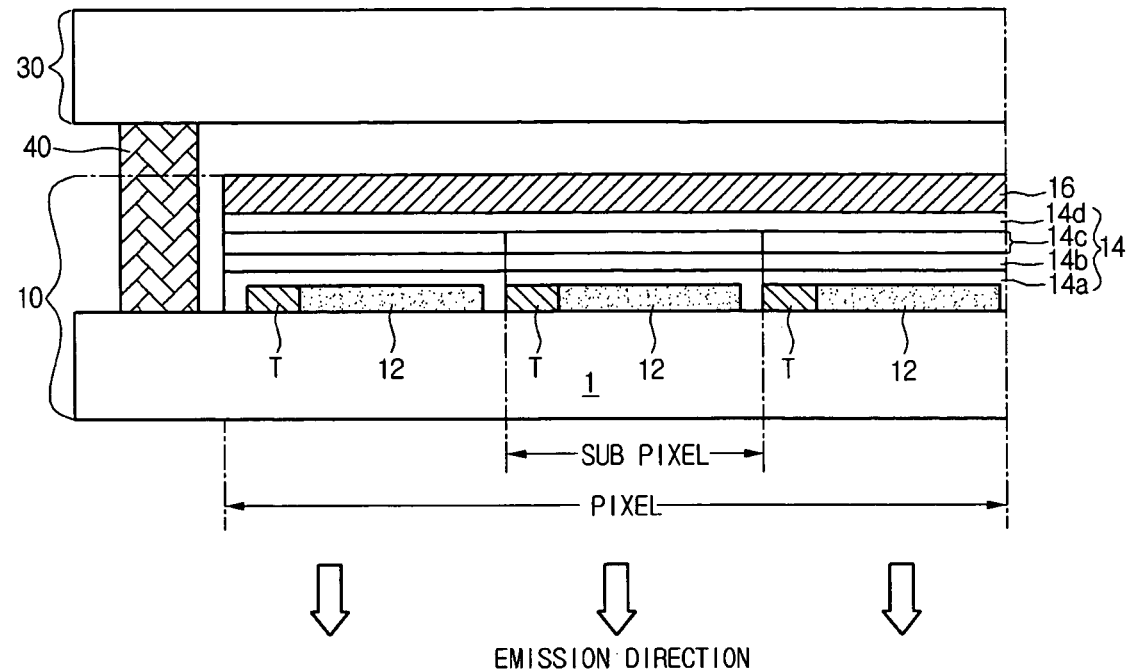
FIG. 2 is a schematic sectional view of a related art bottom emission type organic electro luminescence device.
Figure 3:
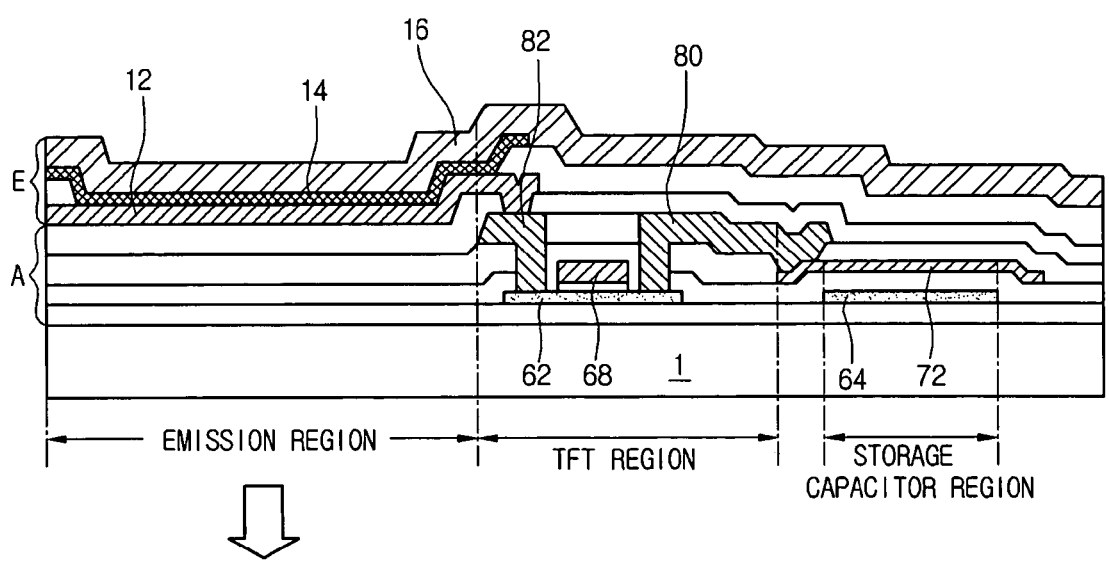
FIG. 3 is an enlarged sectional view of one sub-pixel region in the bottom emission type organic electro luminescence device shown in FIG. 2.
Figure 4:
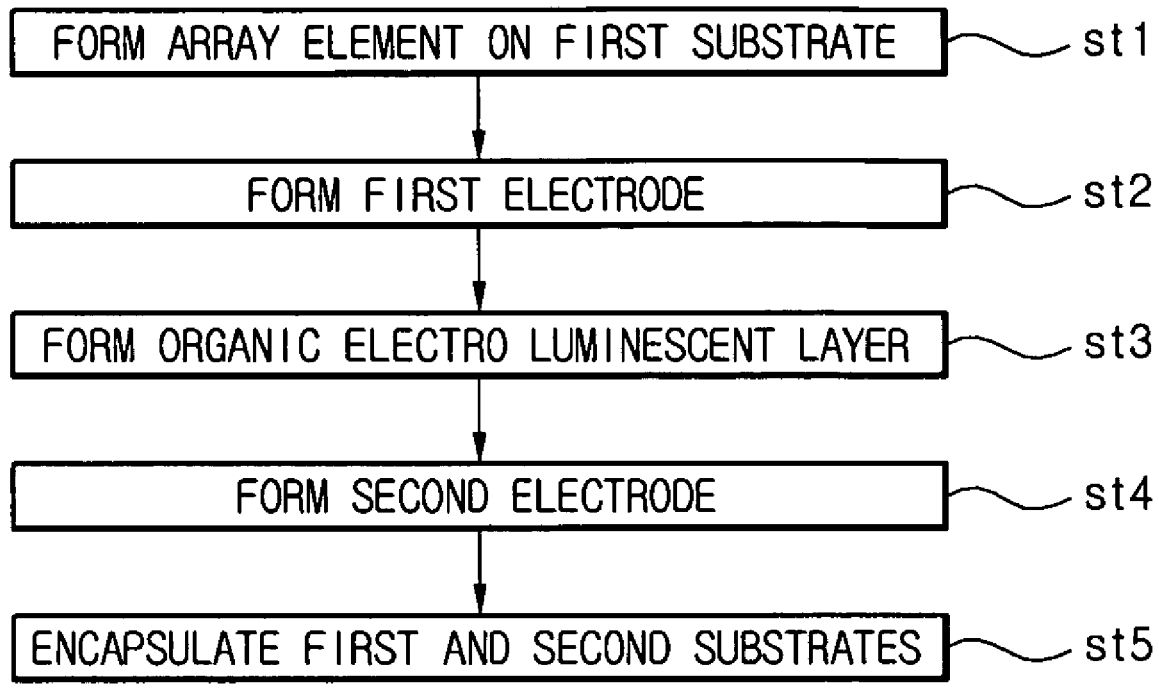
FIG. 4 is a flowchart illustrating a method for fabricating the related art organic electro luminescence device.
Figure 5:
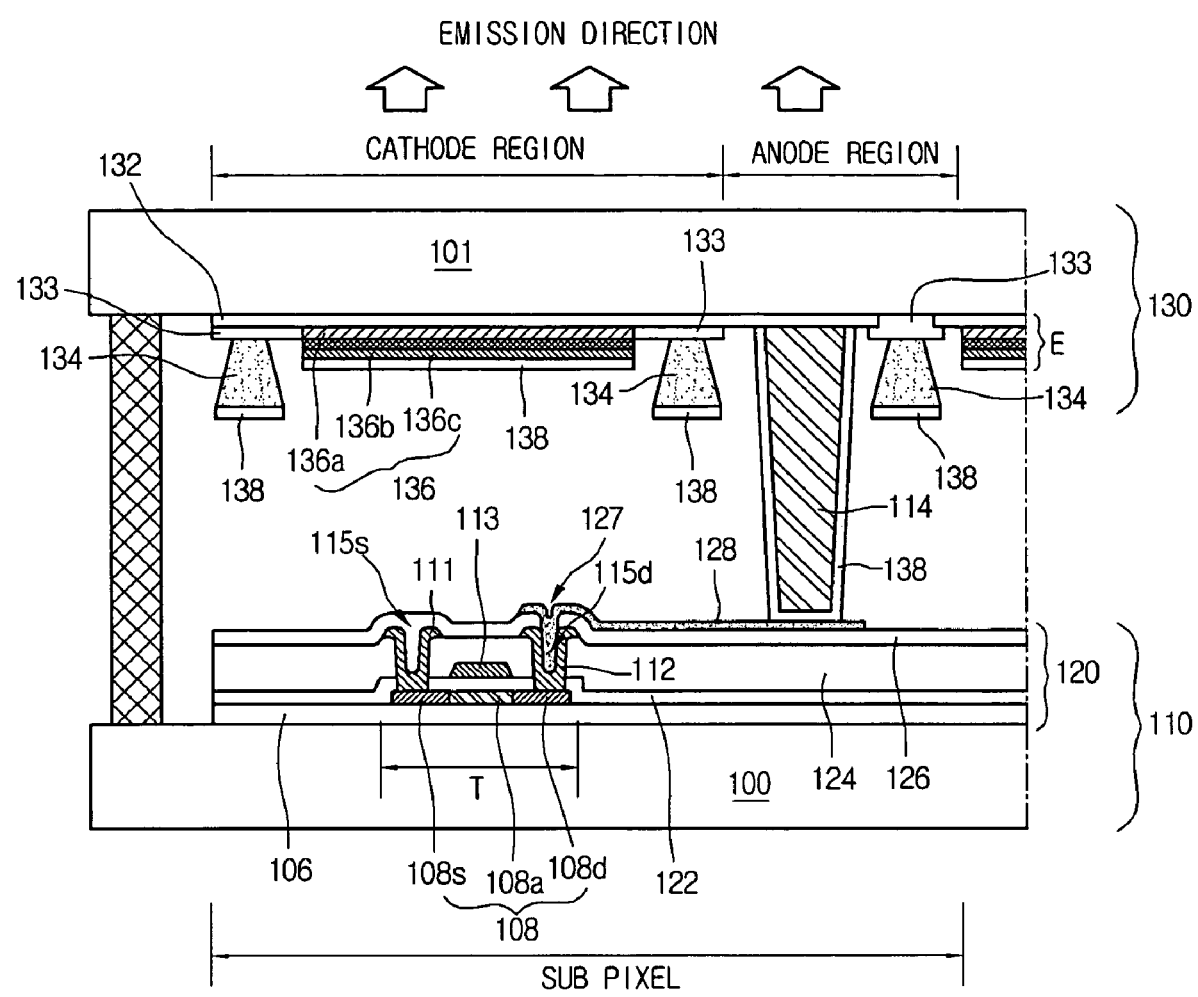
FIG. 5 is a schematic sectional view of a dual panel type organic electro luminescence device according to a first embodiment of the present invention.

FIG. 5 is a schematic sectional view illustrating one sub pixel of a dual panel type organic electro luminescence device according to a first embodiment of the present invention. For convenience, a following description will be made centering on one sub pixel.

Referring to FIG. 5, first and second substrates 110 and 130 are arranged spaced apart from each other by a predetermined distance. An array element 120 is formed in an inner surface of the transparent substrate 100 of a first substrate 110 and an electro luminescent diode E is formed on an inner surface of a transparent substrate 101 of the second substrate 130. Edges of the first and second substrates 110 and 130 are encapsulated by a seal pattern 140.

The organic electro luminescence device includes a cathode region and an anode region. In the anode region, the array element 120 of the first substrate 110 and a conductive spacer 114 are electrically connected to each other.

The electro luminescent diode E is formed in the cathode region. The electro luminescent diode E includes a first electrode 132, a second electrode 138a, and organic electro luminescent layer 136 interposed therebetween. Accordingly, when a voltage is applied to the first and second electrodes 132 and 138a, an electric field is formed between the first and second electrodes 132 and 138a. Due to this electric field, light is emitted from the organic electro luminescent layer 136.

In the related art, since the array element and the electro luminescent diode are formed together, the aperture ratio and light efficiency are degraded. Also, a complicated process results in degradation of product yield.

On the contrary, according to the present invention, the array element 120 and the electro luminescent diode E are formed on the different substrates 110 and 130. Therefore, defect ratio in the process is reduced, thereby increasing product yield. Also, since the organic electro luminescence device is formed regardless of the array element, margin of the organic electro luminescence device is increased, thereby increasing the aperture ratio and the light efficiency.

The first electrode 132 electrically contacts with a connection electrode 128 connected to the drain electrode 112 of the drive TFT T of the array element 120 of the first substrate 110 through the conductive spacer 114.

The electro luminescent diode E includes a first electrode 132 used as a common electrode, a separator 134 disposed at a sub-pixel boundary on the first electrode 132, an organic electro luminescent layer 136 disposed inside the separators 134, and a second electrode 138a patterned for each sub-pixel.

The first electrode 132 is formed over the cathode region and the anode region, while the organic electro luminescent layer 136 and the second electrode 138a are formed in the cathode region.

The organic electro luminescent layer 136 includes a first carrier transporting layer 136a, an emission layer 136b, and a second carrier transporting layer 136c, which are stacked in sequence. The first and second carrier transporting layers 136a and 136c are used to inject electrons or holes into the emission layer 136b, or to transport them.

The first and second carrier transporting layers 136a and 136c are determined by arrangement of anode and cathode electrodes. For example, when the emission layer 136 is formed of high molecular compound and the first and second electrodes 132 and 138a are respectively configured as anode and cathode electrodes, the first carrier transporting layer 136a contacting with the first electrode 132 has a stacked structure of a hole injection layer and a hole transporting layer. Also, the second carrier transporting layer 136c contacting with the second electrode 138a has a stacked structure of an electron injection layer and an electron transporting layer.

The second electrode pattern may remain on the separator 134.

The array element 120 includes the drive TFT T. In order to supply a current to the electro luminescent diode E, cylindrical conductive spacers 114 are disposed at positions where the second electrode 138a and the TFTs T are connected in each sub-pixel.

Unlike the spacer for the general LCD, a main function of the conductive spacer 114 is to electrically connect the drive TFTs of the substrates 132 and 138a and the first electrode 132 rather than to maintain a cell gap. Since a predetermined cylindrical height exists between the two substrates, it will be simply referred to as a spacer.

The connection portion of the conductive spacer 114 and the TFT T will now be described in more detail. A passivation layer 124 is formed at a TFT region. The passivation layer 124 includes a drain contact hole 115d to expose a portion of the drain electrode 112. A drain electrode 112 is formed on the first passivation layer 124 through a drain contact hole 115d. On a second passivation layer 126 where a connection contact hole 127 exposing the drain electrode 112 is formed, a connection electrode 128 is connected to the drain electrode 112 through the connection contact hole 127. The conductive spacer 114 is disposed on the connection electrode 128.

The conductive spacer 114 may be substantially connected to the source electrode 111 or drain electrode 112 of the TFT T.

The conductive spacer 114 can be formed by depositing a conductive material 138b on the patterned spacer using inorganic or organic material and electrically connects the first electrode 132 and the connection electrode 128. However, the present invention is not limited to this. That is, an electrical connection can be achieved using a space formed of a conductive material.

The conductive material 114 is selected from conductive materials, preferably metal material having ductility and low specific resistance.

The conductive spacer 114 can be formed on the first electrode 132 of the anode region after forming the organic electro luminescent layer 136 on the second substrate 130. Also, the conductive spacer 114 can be formed on the connection electrode 128 in the process of forming the array element 120. The TFT T corresponds to the drive TFT T connected to the first electrode 132.

According to an embodiment of the present invention, the organic electro luminescence device is a top emission type that emits light from the organic electro luminescent layer 136 toward the second substrate 130. Therefore, it is preferable that the first electrode 132 is selected from conductive materials having a transmissive property, while the second electrode 138a is selected from opaque metal materials.

The first substrate 110 with the array element 120 includes a buffer layer 106 between the transparent substrate 100 and the semiconductor layer 108. The semiconductor layer 108 is formed of polysilicon on the buffer layer 106, and a gate insulating layer 122 is formed on the semiconductor layer 108.

Source and drain impurity regions 108s and 108d are formed by doping impurity ions into both sides of the semiconductor layer 108. An active layer 108a is formed between the source and drain impurity regions 108s and 108d. A gate electrode 113 is formed at the central portion of the semiconductor layer 108 on the gate insulating layer 122. A first passivation layer 124 is formed on the gate electrode 113. Source and drain contact holes 115s and 115d are formed on the first passivation layer 124 and the gate insulating layer 122. Source and drain electrodes 111 and 112 are formed to contact with the source and drain impurity regions 108s and 108d through the source and drain contact holes 115s and 115d. A second passivation layer 126 of an insulating material is formed on the source and drain electrodes 111 and 112. A connection contact hole 127 is formed on the second passivation layer 126 to expose a portion of the drain electrode 112. A connection electrode 128 is formed on the second passivation layer 126. The connection electrode 128 is electrically connected to the drain electrode 112 through the connection contact hole 127. The connection electrode 128 contacts with the conductive spacer 114 so that it is electrically connected to the first electrode 132 serving as the anode electrode of the second substrate 130.

Meanwhile, the space between the first substrate 110 and the second substrate 130 can be filled with inert gas or insulating liquid.

Although not shown in the drawing, the array element 120 further includes a scan line, a signal line and a power line crossing over the scan line and spaced apart from each other by a predetermined distance, a switching TFT disposed at an overlapped portion of the scan line and the signal line, and a storage capacitor.

FIGS. 6A to 6E are sectional views illustrating a fabrication method of a dual panel type organic electro luminescence device according to an embodiment of the present invention.

Figure 6A:
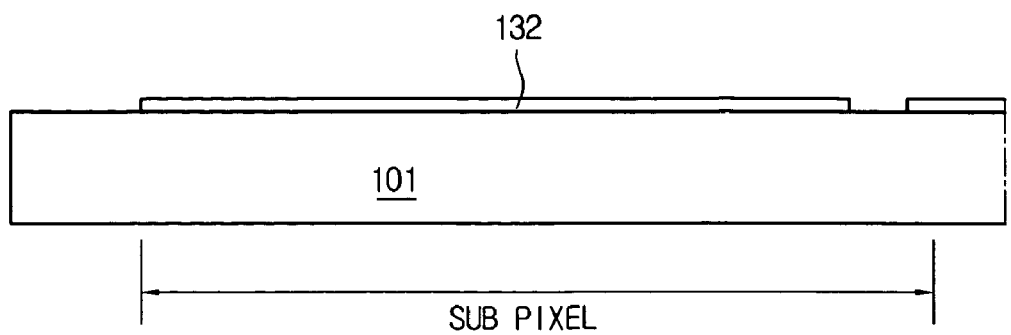
FIGS. 6A to 6E are sectional views illustrating a fabrication method of the dual panel type organic electro luminescence device according to an embodiment of the present invention.

Referring to FIG. 6A, in the second substrate 130 where the electro luminescent diode E is formed, a first electrode 132 is formed on a transparent substrate 101 in each sub pixel.

The first electrode 132 is formed of a transparent conductive material. The first electrode 132 can be formed, for example, of indium tin oxide (ITO), indium zinc oxide (IZO), and/or indium tin zinc oxide (ITZO).

Figure 6B:
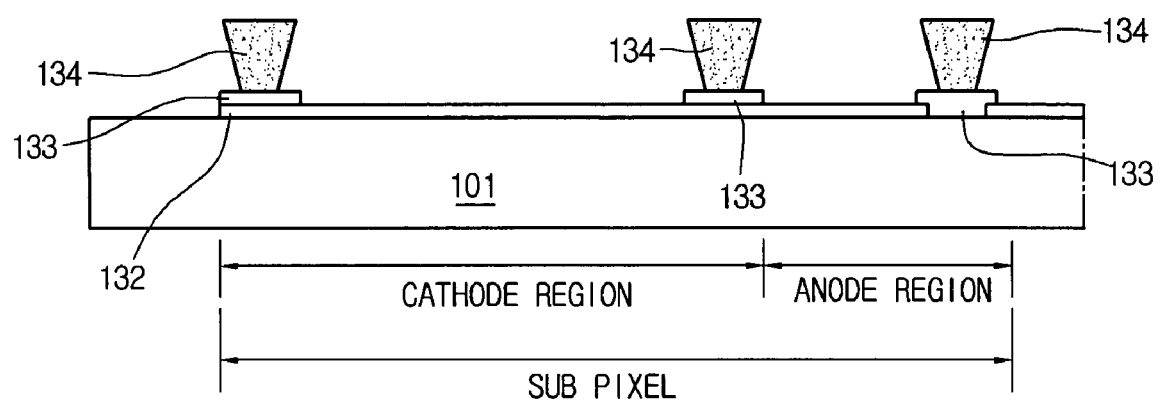

Referring to FIG. 6B, a bank 133 and a separator 134 are formed on the first electrode 132. The bank 133 is formed of an insulating material and separates a cathode region and an anode region. The separator 134 is formed on the bank 133 in a reversely tapered pattern.

Due to the separator 134, a second electrode 138a can be formed in the cathode region in each sub pixel.

The separator 134 is formed at a boundary of the sub pixels and a boundary of the cathode region and the anode region. The separator 134 separates the sub pixels from one another and separates the cathode region and the anode region.

Figure 6C:
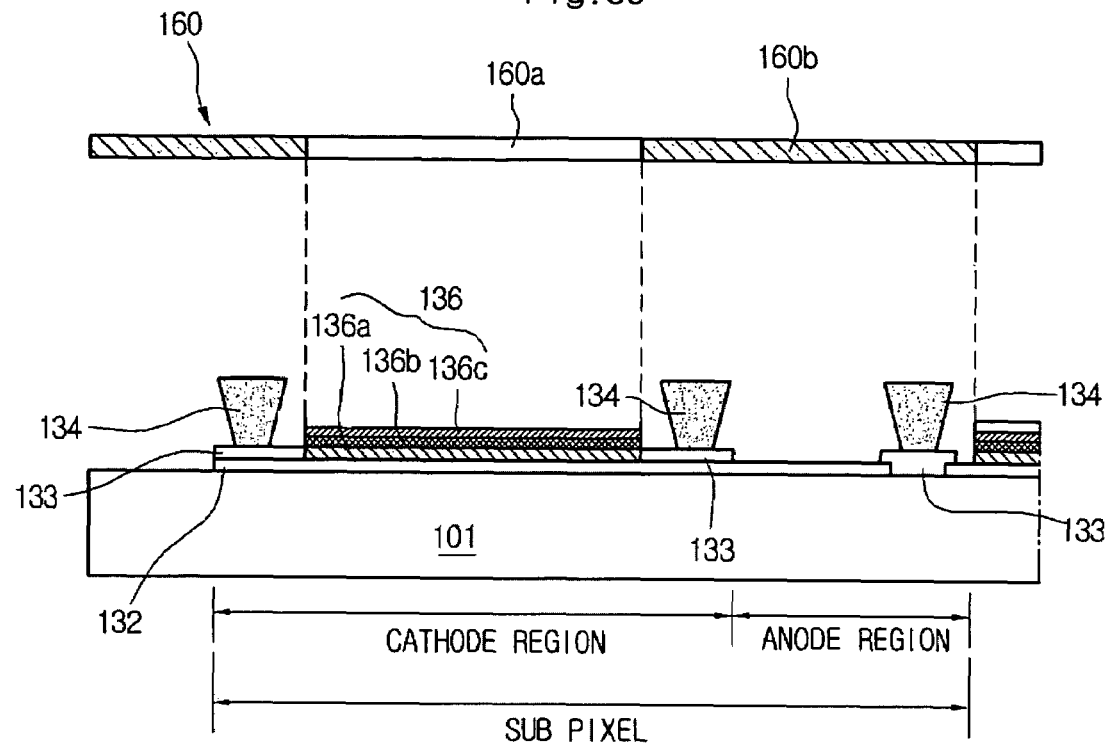

Referring to FIG. 6C, a material for an organic electro luminescent layer 136 are formed on the second substrate 130 to cover a shadow mask 160 in which a transmitting part 160a and a blocking part 160b are alternately repeated.

Figure 7A:
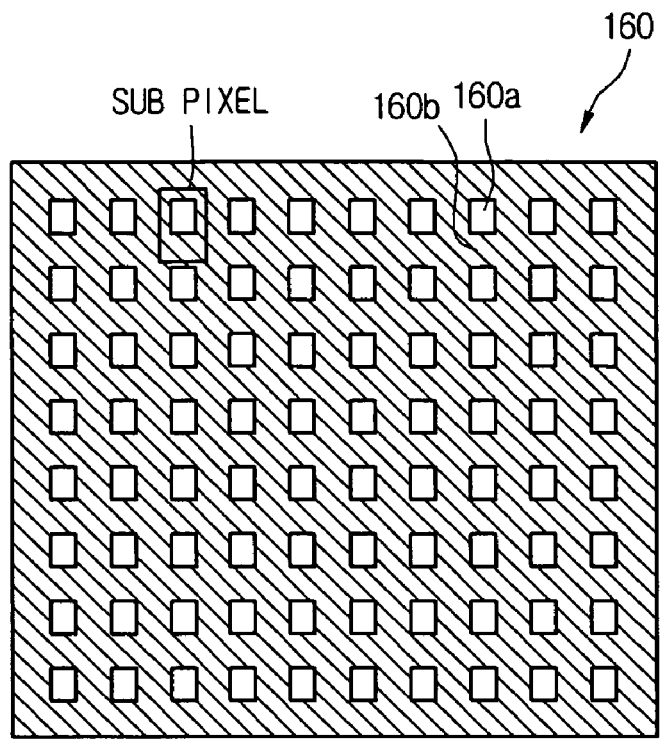
FIGS. 7A and 7B are views of a shadow mask used in fabricating the organic electro luminescent layer.
Figure 7B:
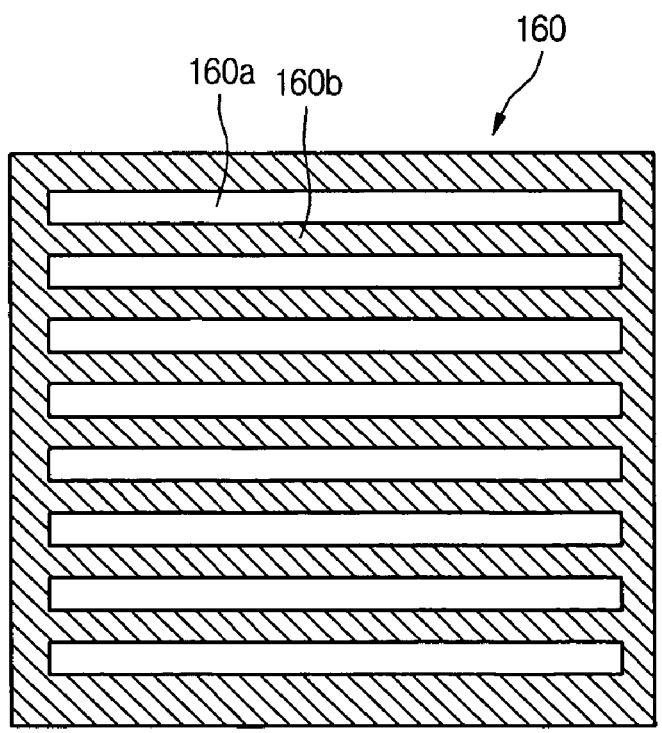

FIGS. 7A and 7B are views of the shadow mask 160 used in forming the organic electro luminescent layer 136.

Referring to FIG. 7A, in the shadow mask 160, the transmitting part 160a and the blocking part 160b form one sub pixel. The transmitting part 160a is formed at every other sub pixel.

Accordingly, when the organic electro luminescent layer 136 is formed in the cathode region of the sub pixel by using the shadow mask 160, the shadow mask 160 is shifted in one direction.

In the shadow mask 160 shown in FIG. 7B, the transmitting part 160a is formed such that the cathode regions of the pixels are all opened.

The transmitting part 160a corresponds to the cathode region in the sub pixel and the blocking part 160b corresponds to the anode region.

Specifically, the organic electro luminescent layer 136 includes a first carrier transporting layer 136a, an emission layer 136b, and a second carrier transporting layer 136c, which are stacked in sequence. The first and second carrier transporting layers 136a and 136c are used to inject electrons or holes into the emission layer 136b, or to transport them.

The first and second carrier transporting layers 136a and 136c are determined by arrangement of anode and cathode electrodes. For example, when the emission layer 136 is formed of high molecular compound and the first and second electrodes 132 and 138a are respectively configured as anode and cathode electrodes, the first carrier transporting layer 136a contacting with the first electrode 132 has a stacked structure of a hole injection layer and a hole transporting layer. Also, the second carrier transporting layer 136c contacting with the second electrode 138a has a stacked structure of an electron injection layer and an electron transporting layer.

The organic electro luminescent layer 136 is formed only in the cathode region because of the shadow mask 160 with the transparent part 160a and the blocking part 160b.

Figure 6D:
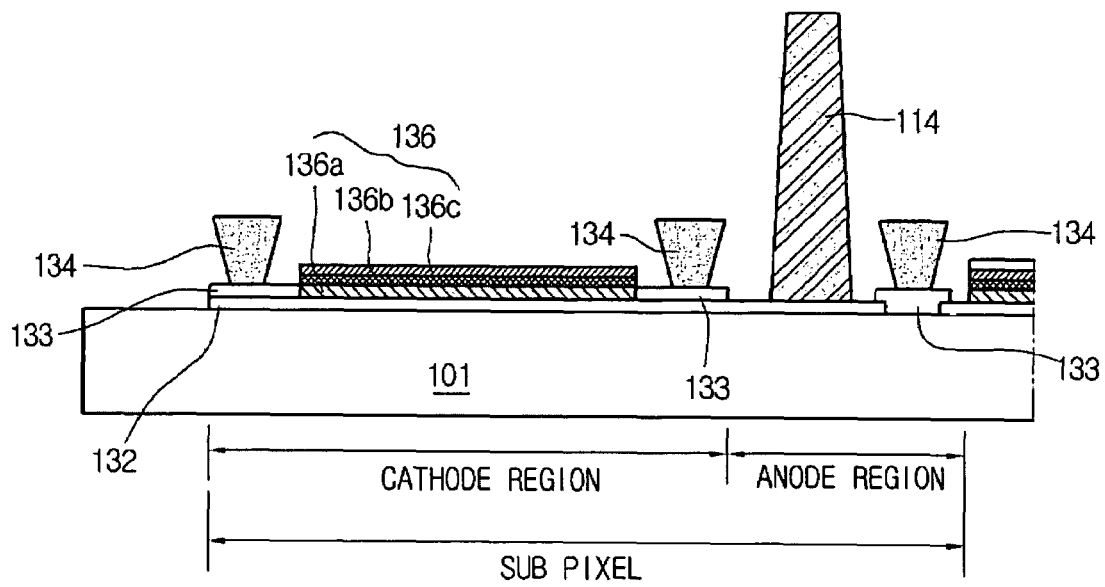

Referring to FIG. 6D, a spacer 114 is formed of an organic material or inorganic material on the first electrode 132 in which the anode region is exposed. Alternatively, the spacer 114 may be formed before forming the organic electro luminescent layer 136, for example, the spacer 114 may be formed after forming the separator 134 shown in FIG. 6B.

Figure 6E:
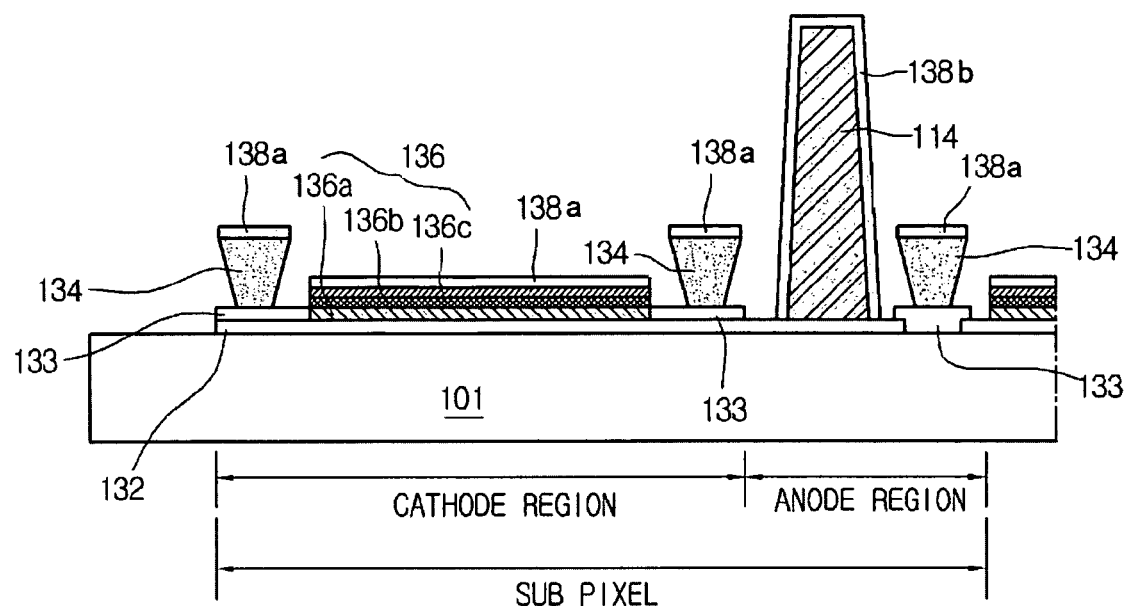

Referring to FIG. 6E, a conductive material is coated on an entire surface of the second substrate 130, and then the conductive material is patterned. The conductive material is a transparent conductive material, such as ITO, IZO, and ITZO.

The second electrode 138a is formed on the reversely tapered separator 134. The second electrode 138a is formed on the organic electro luminescent layer 136 of the cathode region separated by the separators 134.

The patterned conductive material 138b is formed on the spacer 114 of the anode region to form the conductive spacer 114 electrically connected to the first electrode 132.

In the dual panel type organic electro luminescence device, the first and second electrodes 132 and 138a acting as the cathode electrode and the anode electrode are formed in a horizontal structure.

Like this, the second substrate 130 is divided into the cathode region and the anode region. The anode region is electrically connected to the array element 120 of the first substrate 110 by the conductive spacer 114.

A signal applied through the conductive spacer 114 can form an electric field between the first and second electrodes 132 and 138a, with the organic electro luminescent layer 136 being interposed therebetween.

FIGS. 8A to 8E are sectional views illustrating a process of forming the substrate in which the array element is formed.

Figure 8A:
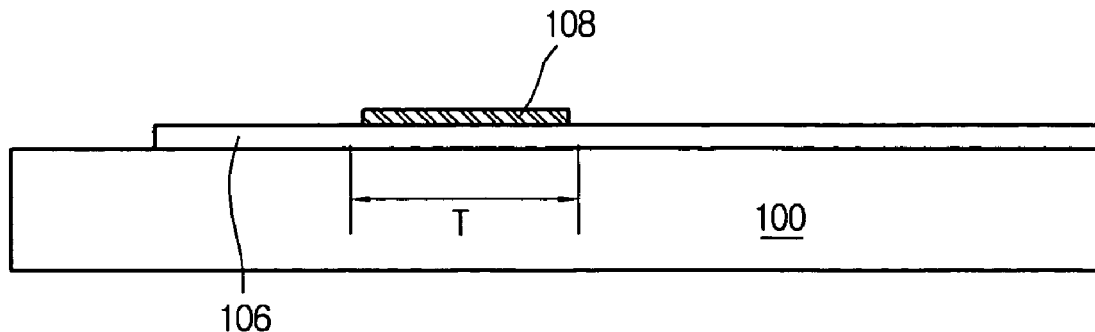
FIGS. 8A to 8E are sectional views illustrating a fabrication method of an organic electro luminescence device according to an embodiment of the present invention.

Referring to FIG. 8A, the first substrate 110 includes a buffer layer 106 between a transparent substrate 100 and a semiconductor layer 108.

The semiconductor layer 108 is formed of polysilicon on the buffer layer 106

Figure 8B:
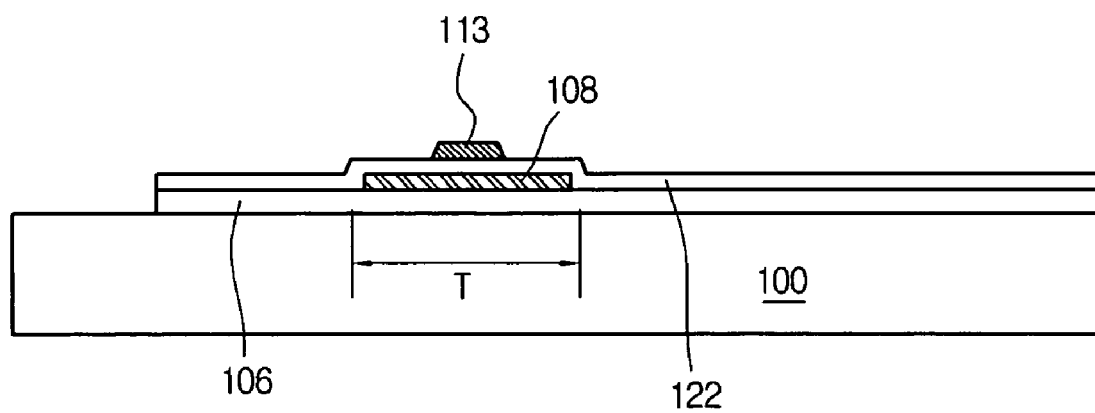

Referring to FIG. 8B, a gate insulating layer 122 is formed on the semiconductor layer 108. A gate electrode 113 is formed at the central portion of the semiconductor layer 108.

Figure 8C:
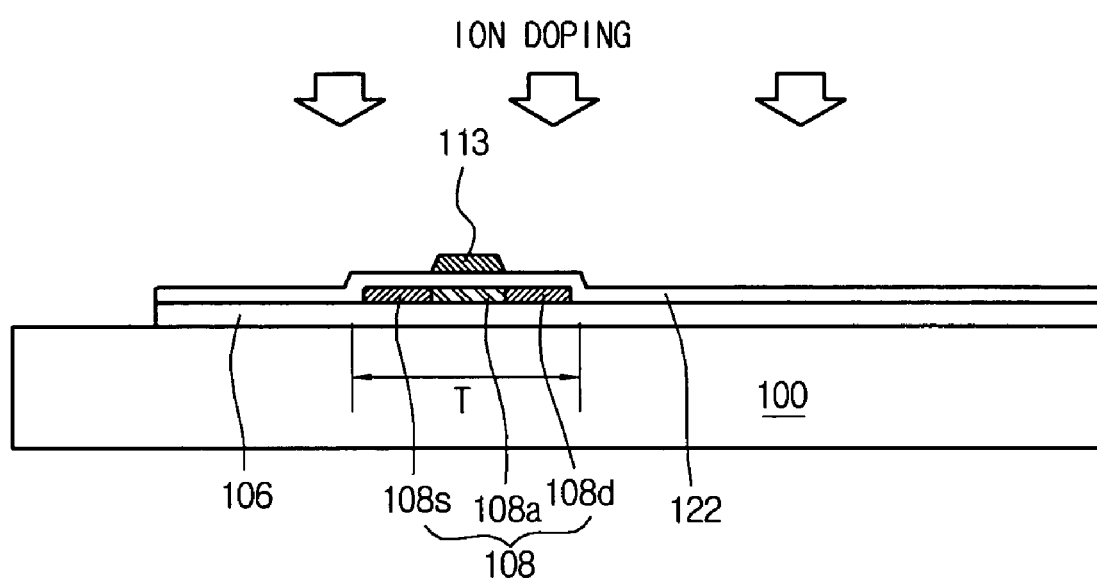

Referring to FIG. 8C, using the gate electrode 113 as a mask, source and drain impurity regions 108s and 108d are formed by doping impurity ions into both sides of the semiconductor layer 108. An active layer 108a is formed between the source and drain impurity regions 108s and 108d.

Figure 8D:
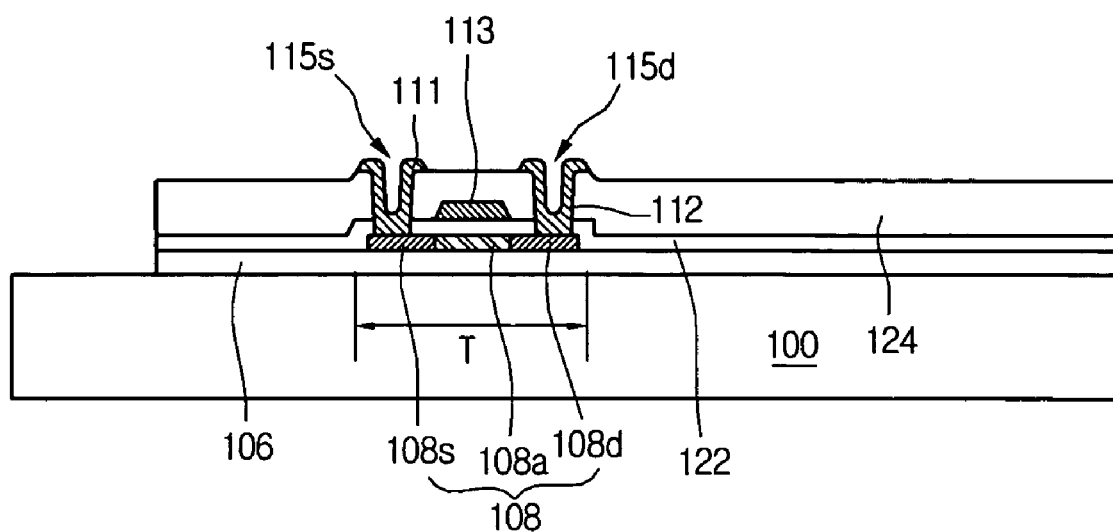

Referring to FIG. 8D, a first passivation layer 124 is formed on the gate electrode 113. Source and drain contact holes 115s and 115d are formed on the first passivation layer 124 and the gate insulating layer 122, so that the source and drain contact holes 115s and 115d expose the source and drain impurity regions 108s and 108d through the first passivation layer 124 and the gate insulating layer 122. Source and drain electrodes 111 and 112 are formed to contact with the source and drain impurity regions 108s and 108d through the source and drain contact holes 115s and 115d.

Figure 8E:
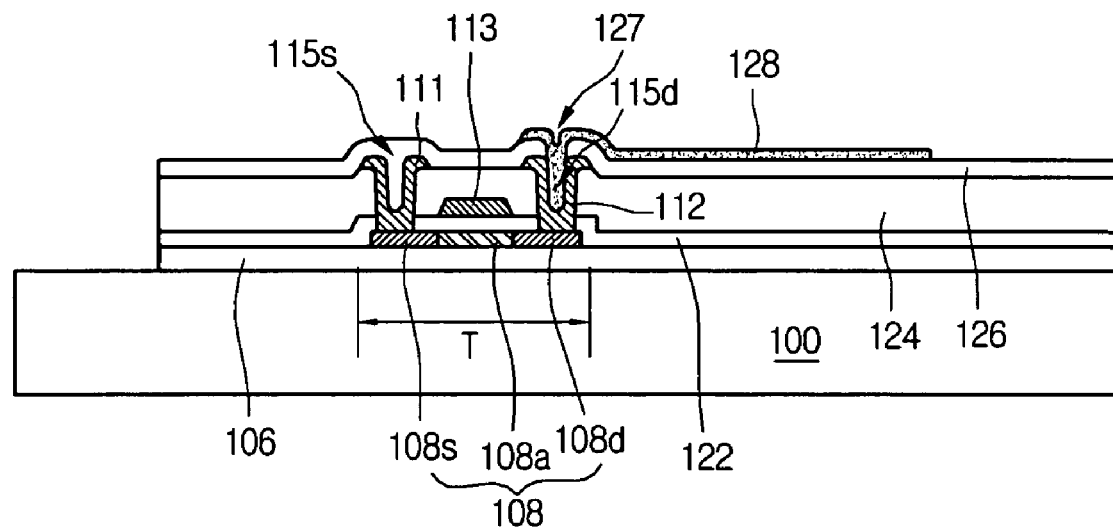

Referring to FIG. 8E, a second passivation layer 126 is formed on the source and drain electrodes 111 and 112. A connection contact hole 127 is formed on the second passivation layer 126 to expose a portion of the drain electrode 112. A connection electrode 128 is formed on the second passivation layer 126. The connection electrode 128 is electrically connected to the drain electrode 112 through the connection contact hole 127.

The connection electrode 128 contacts with the conductive spacer 114 so that it is electrically connected to the first electrode 132 serving as the anode electrode of the second substrate 130.

The first and second substrates 110 and 130 are arranged to face each other. Edge portions of the first and second substrates 110 and 130 are encapsulated by a seal pattern 140.

Meanwhile, the space between the first substrate 110 and the second substrate 130 can be filled with inert gas or insulating liquid.

Since the array element and the electro luminescent diode are formed on the different substrates, the electro luminescent diode is not affected by the yield of the array element, thereby enhancing the efficiency of production management.

Also, if the screen is configured with the top emission type, the TFTs can be designed without considering the aperture ratio, thereby increasing process efficiency and providing high aperture ratio/high resolution. Since the electro luminescent diode is formed in the dual panel type, outside air can be effectively blocked, thereby increasing the stability of the product.

Further, since low temperature polycrystalline silicon (LTPS) TFTs are formed using polycrystalline silicon with high charge mobility in the array element, the reliability of the bottom substrate can be secured. Thus, it is applicable to large-sized substrates.

The TFTs applied to the organic electro luminescence device of the present invention can be applied to various types of TFTs, in addition to the top gate type transistor.

Figure 9:
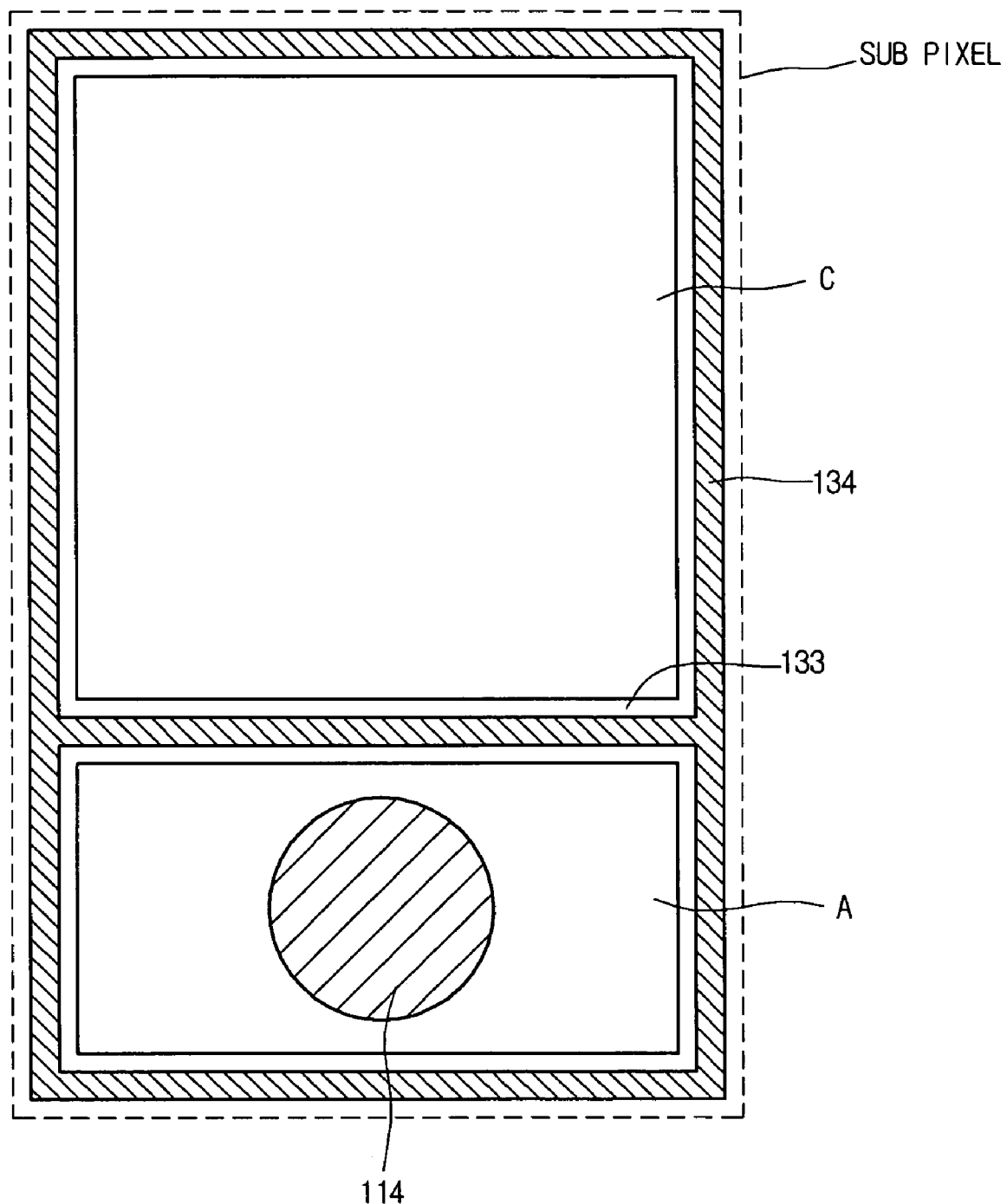
FIG. 9 is a plan view of one sub pixel for explaining a second substrate of the dual panel type organic electro luminescence device according to an embodiment of the present invention.

FIG. 9 is a plan view of one sub pixel for explaining the second substrate of the dual panel type organic electro luminescence device according to an embodiment of the present invention.

Referring to FIG. 9, a cathode region C and an anode region A are formed on one sub pixel of the second substrate 130 in a horizontal structure. The anode region A is formed by electrically connecting the first electrode 132 to the conductive spacer 114.

A first electrode 132, an organic electro luminescent layer 136, and a second electrode 138a are sequentially stacked in the cathode region C. The cathode region C and the anode region A are separated by a bank 133 and a separator 134.

Accordingly, the first electrode 132 can be formed as one body over the cathode region C and the anode region A through a lower portion of the separator 134.

Figure 10:
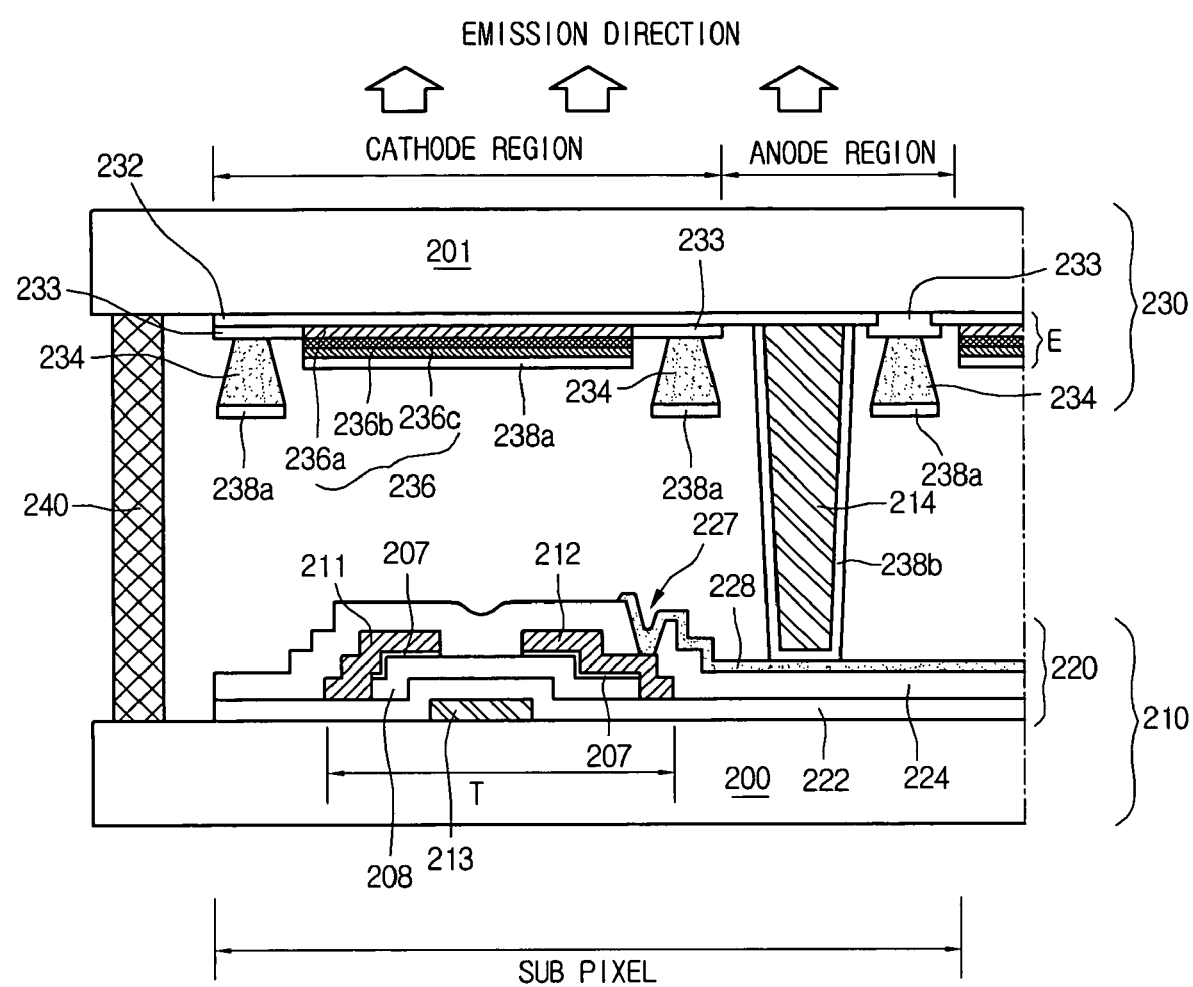
FIG. 10 is a sectional view of one sub pixel in a dual panel type organic electro luminescence device according to a second embodiment of the present invention.

FIG. 10 is a sectional view of one sub pixel in a dual panel type organic electro luminescence device according to a second embodiment of the present invention.

A description about the same elements as in FIG. 5 will be omitted, and a description about like reference numerals will also be omitted.

Referring to FIG. 10, first and second substrates 210 and 230 are arranged spaced apart from each other by a predetermined distance. An array element 220 is formed in an inner surface of a transparent substrate 200 of the first substrate 210. An electro luminescent diode E is formed in an inner surface of a transparent substrate 210 of the second substrate 230. Edges of the first and second substrates 210 and 230 are encapsulated by a seal pattern 240.

The second substrate 230 is divided into a cathode region and an anode region. The anode region is electrically connected to the array element 220 of the first substrate 210 by the conductive spacer 214.

The electro luminescent diode E is formed in the cathode region. The electro luminescent diode E is formed by interposing an organic electro luminescent layer 236 between the first electrode 232 and the second electrode 238. Accordingly, a voltage applied to the first and second electrodes 232 and 238 forms an electric field between the first and second electrodes 232 and 238. Due to this electric field, light is emitted from the organic electro luminescent layer 236.

As described above, the first and second electrodes 232 and 238 acting as the cathode electrode and the anode electrode are formed on a single substrate in a horizontal structure.

The first electrode 232 acting as the anode electrode electrically contacts with the drain electrode 212 of the drive TFT T of the array element 220 or the connection electrode pattern connected to the drive TFT T.

The array element 220 includes TFTs. In order to supply a current to the electro luminescent diode, a cylindrical conductive spacer 214 is located at a position where the second electrode 238 and the TFT T are connected in each sub pixel.

The TFT T corresponds to the drive TFT T connected to the first electrode 232.

In the TFT, a gate electrode 213 is formed on the transparent substrate 200, and a gate insulating layer 222 is formed on the gate electrode 213. An active layer 208 of amorphous silicon (a-Si) is formed on the gate insulating layer 222 in which the gate electrode 213 is located. An ohmic contact layer 207 is formed on both sides of the active layer 208 using amorphous silicon into which impurities are doped. Source and drain electrodes 211 and 212 are formed to contact with the ohmic contact layer 207 and spaced apart from each other by a predetermined distance. A passivation layer 224 is formed on the source and drain electrodes 211 and 212. The passivation layer 224 includes a drain contact hole 227 exposing a portion of the drain electrode 212. A connection electrode 228 is formed on the passivation layer 224 such that it contacts with the drain electrode 212 through the drain contact hole 227. The connection electrode 228 contacts with the conductive spacer 214 and is electrically connected to the first electrode 232 acting as the anode electrode of the second substrate 230.

Meanwhile, the space I between the first substrate 210 and the second substrate 230 can be filled with inert gas or insulating liquid.

Although not shown in the drawing, the array element 220 further includes a scan line, a signal line and a power line crossing over the scan line and spaced apart from each other by a predetermined distance, a switching TFT disposed at an overlapped portion of the scan line and the signal line, and a storage capacitor.

As described above, since the array element and the electro luminescent diode are formed on the different substrates, the electro luminescent diode is not affected by the yield of the array element, thereby enhancing the efficiency of production management.

Also, if the screen is configured with the top emission type, the TFTs can be designed without considering the aperture ratio, thereby increasing process efficiency and providing high aperture ratio/high resolution.

Further, since LTPS TFTs are formed using polycrystalline silicon with high charge mobility in the array element, the reliability of the bottom substrate can be secured. Thus, it is applicable to large-sized substrates.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic electro luminescence device comprising:
   first and second substrates arranged spaced apart from each other by a predetermined distance;
   an array element including a switching TFT (thin film transistor) corresponding to a sub pixel on the first substrate;
   a first electrode disposed corresponding to the sub pixel on the second substrate;
   a separator separating the sub pixel into a first region and a second region on the first electrode;
   an organic electro luminescent layer and a second electrode formed on the first electrode of the first region;
   a spacer electrically connecting the first electrode of the second region and the array element; and
   an insulating bank contacting an edge of the organic electro luminescent layer, the separator disposed on the bank such that the separator does not contact the organic electro luminescent layer.

2. The organic electro luminescence device according to claim 1, further comprising a seal pattern encapsulating edges of the first and second substrates.

3. The organic electro luminescent device according to claim 1, wherein the switching TFT includes:
   a buffer layer formed on the first substrate;
   a semiconductor layer containing polycrystalline silicon on the buffer layer;
   a gate insulating layer and a gate electrode formed on the semiconductor layer;
   a first passivation layer formed on the gate electrode; and
   source and drain electrodes formed on the semiconductor layer, the source and drain electrodes passing through the gate insulating layer and the first passivation layer.

4. The organic electro luminescence device according to claim 3, further comprising:
   a second passivation layer formed on the source and drain electrodes; and a connection electrode passing through the second passivation layer and connected to the drain electrode.

5. The organic electro luminescence device according to claim 1, wherein the switching TFT includes:
   a gate electrode formed on the first substrate;
   a gate insulating layer formed on the gate electrode;
   a semiconductor layer containing amorphous silicon on the gate insulating layer; and
   source and drain electrodes formed on the semiconductor substrate and spaced apart from each other by a predetermined distance.

6. The organic electro luminescence device according to claim 5, further comprising:
   a passivation layer formed on the source and drain electrodes; and
   a connection electrode passing through the passivation layer and being connected to the drain electrode.

7. The organic electro luminescence device according to claim 1, wherein the spacer comprises a conductive material.

8. The organic electro luminescence device according to claim 1, wherein the spacer includes an organic or inorganic material and a conductive material formed on a surface thereof.

9. The organic electro luminescence device according to claim 1, wherein the first and second electrodes comprise a transparent conductive electrode material.

10. The organic electro luminescence device according to claim 1, wherein one of the first and second electrodes comprises a transparent conductive electrode material and the other of the first and second electrodes comprises an opaque conductive electrode material.

11. The organic electro luminescence device according to claim 1, wherein the spacer contacts a drain electrode of the switching TFT and the first electrode.

12. The organic electro luminescence device according to claim 1, wherein the spacer is formed on one of the first and second substrates.

13. The organic electroluminescence device according to claim 1, wherein the separator has a reversely tapered pattern.

14. The organic electro luminescence device according to claim 1, wherein the organic electro luminescent layer and second electrode are separated from the separator by a predetermined distance.

15. The organic electro luminescence device according to claim 1, further comprising an insulating bank formed on and separating the first electrode of adjacent sub pixels.

16. The organic electro luminescence device according to claim 1, wherein the spacer is formed on the first electrode.

17. An organic electro luminescence device comprising: first and second substrates spaced apart from each other by a predetermined distance;
   an array element including a switching TFT (thin film transistor) corresponding to a sub pixel on the first substrate, the sub pixel being divided into a first region and a second region;
   an electro luminescent diode formed corresponding to the sub pixel on the second substrate; and
   a spacer electrically connecting the array element and the electro luminescent diode;
   a separator formed on the first substrate so as to separate the sub pixel into the first region and the second region; and
   an insulating bank contacting an edge of the electro luminescent diode, the separator disposed on the bank such that the separator does not contact the electro luminescent diode.

18. The organic electro luminescence device according to claim 17, wherein the electro luminescent diode includes:
   a first electrode formed on the first substrate over the first and second regions;
   an organic electro luminescent layer formed on a first electrode of one of the first and second regions; and
   a second electrode formed on the organic electro luminescent layer.

19. The organic electroluminescence device according to claim 17, wherein the spacer is electrically connected to an electrode of the array element and an electrode of the electro luminescent diode.

20. The organic electro luminescence device according to claim 19, wherein the spacer is formed in one of the first and second regions.

21. The organic electro luminescence device according to claim 19, wherein the spacer includes an organic or inorganic insulating material and a conductive material formed on a surface thereof, the insulating material contacting the electrode of the electrode of the electro luminescent diode.

22. The organic electro luminescence device according to claim 18, further comprising the insulating bank contacting an edge of the organic electro luminescent layer.

23. The organic electro luminescence device according to claim 18, further comprising the insulating bank separating adjacent sub pixels.

24. The organic electroluminescence device according to claim 17, wherein the spacer is formed on the second substrate.

* * * * *

UNITED STATES PATENT AND TRADEMARK OFFICE
CERTIFICATE OF CORRECTION

PATENT NO.        : 7,531,833 B2                                           Page 1 of 1
APPLICATION NO.   : 11/257409
DATED             : May 12, 2009
INVENTOR(S)       : Kim et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 662 days.

Signed and Sealed this
Twenty-ninth Day of March, 2011

David J. Kappos
*Director of the United States Patent and Trademark Office*